(12) United States Patent
Iwase et al.

(10) Patent No.: US 8,241,984 B2
(45) Date of Patent: Aug. 14, 2012

(54) SEMICONDUCTOR DEVICE AND METHOD FOR MANUFACTURING THE SAME

(75) Inventors: Masao Iwase, Yokohama (JP); Tadashi Iguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 12/917,689

(22) Filed: Nov. 2, 2010

(65) Prior Publication Data
US 2011/0053363 A1 Mar. 3, 2011

Related U.S. Application Data

(62) Division of application No. 12/135,339, filed on Jun. 9, 2008, now Pat. No. 7,847,337.

(30) Foreign Application Priority Data

Jun. 12, 2007 (JP) ................................ 2007-155614

(51) Int. Cl.
*H01L 21/336* (2006.01)
(52) U.S. Cl. ........ 438/264; 438/199; 438/201; 438/221; 438/257; 438/270; 257/296; 257/298; 257/300; 257/316; 257/350; 257/E21.688
(58) Field of Classification Search .................. None
See application file for complete search history.

(56) References Cited

U.S. PATENT DOCUMENTS

| 2002/0036317 | A1* | 3/2002 | Matsui et al. ................. 257/315 |
| 2005/0189606 | A1 | 9/2005 | Nakagawa |
| 2005/0236661 | A1 | 10/2005 | Matsui et al. |
| 2007/0267685 | A1 | 11/2007 | Ishibashi |

FOREIGN PATENT DOCUMENTS

JP 2002-176114 6/2002

OTHER PUBLICATIONS

E.F. Schubert, "Wet chemical etching of the Si/SiO$_2$ material system using BOE," Course Teaching Modules http://www.ecse.rpi.edu/~schubert/Course-Teaching -modules/A26-Wet-chemical-etching-of-Si02-with-BOE.pdf, p. A26, last modified Jan. 19, 2010.

\* cited by examiner

*Primary Examiner* — Kyoung Lee
(74) *Attorney, Agent, or Firm* — Finnegan, Henderson, Farabow, Garrett & Dunner, L.L.P.

(57) ABSTRACT

A semiconductor device including a semiconductor substrate, and a memory cell and a peripheral circuit provided on the semiconductor substrate, the memory cell having a first insulating film, a first electrode layer, a second insulating film, and a second electrode layer provided on the semiconductor substrate in order, and the peripheral circuit having the first insulating film, the first electrode layer, the second insulating film having an opening for the peripheral circuit, and the second electrode layer electrically connected to the first electrode layer through the opening for the peripheral circuit, wherein a thickness of the first electrode layer under the second insulating film of the peripheral circuit is thicker than a thickness of the first electrode layer of the memory cell.

7 Claims, 3 Drawing Sheets

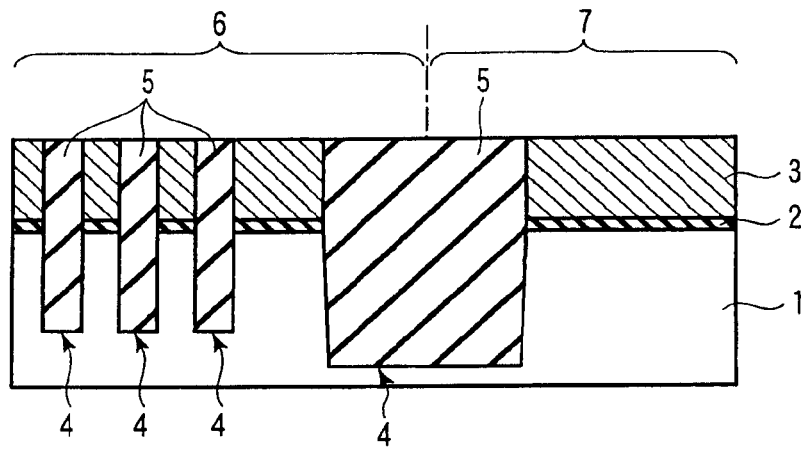
F I G. 1A
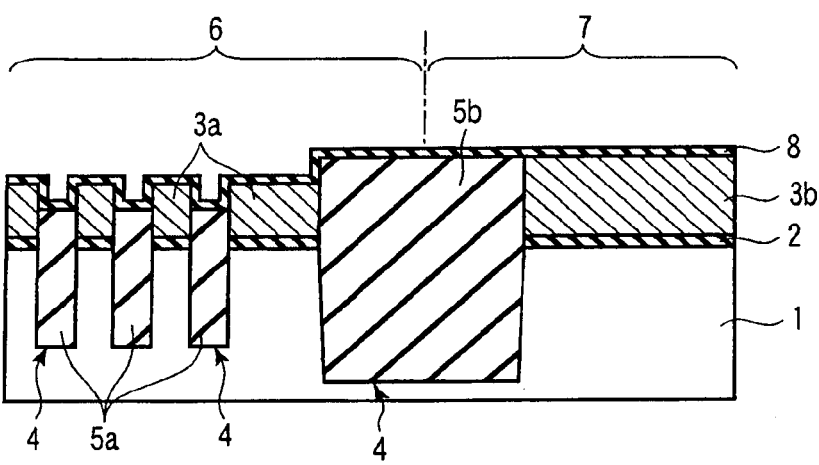
F I G. 1B
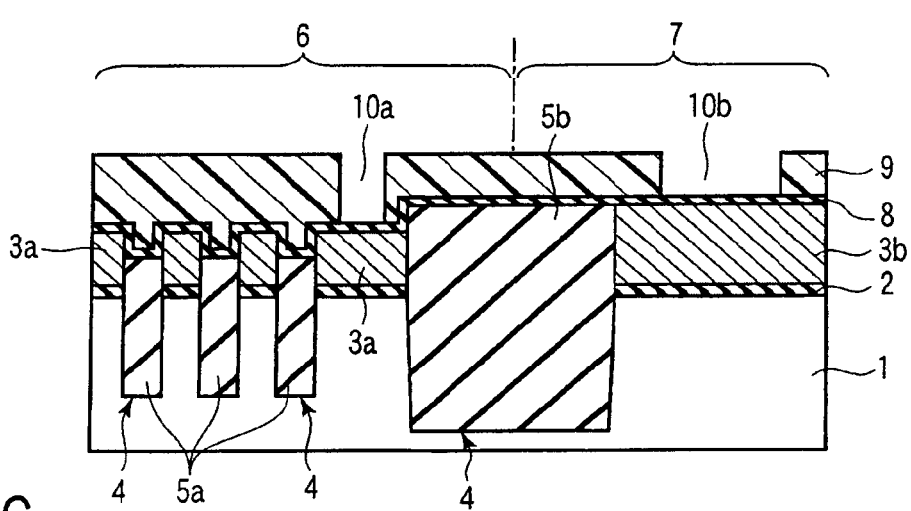
F I G. 1C

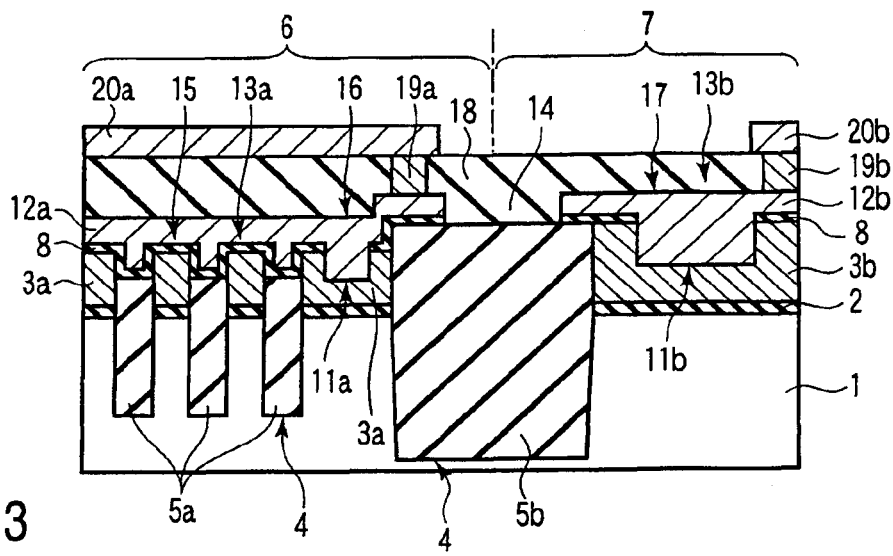
FIG. 3
| Opening area (μm²) | Etching depth (nm) |
|---|---|
| 0.005 | 15 |
| 0.008 | 16 |
| 0.01 | 18 |
| 0.015 | 20 |
| 0.02 | 23 |
| 0.03 | 25 |
| 0.05 | 28 |
| 0.07 | 29 |
| 0.08 | 30 |
| 0.1 | 30 |
| 0.12 | 31 |
FIG. 4
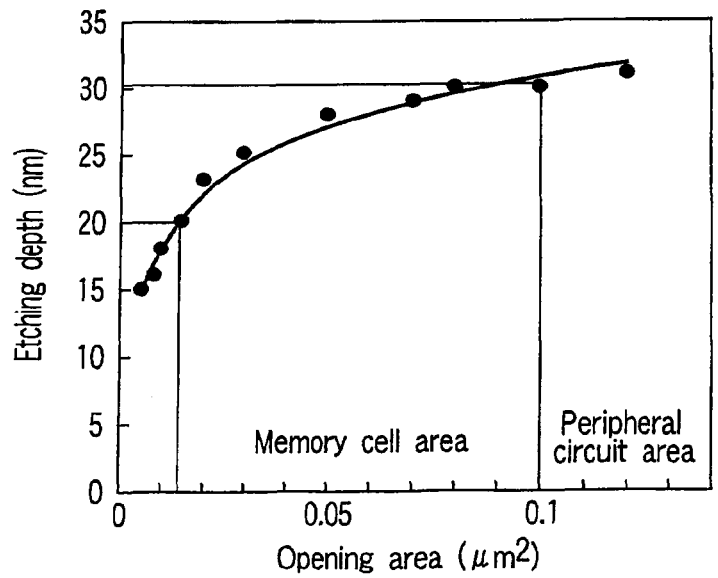
FIG. 5

SEMICONDUCTOR DEVICE AND METHOD FOR MANUFACTURING THE SAME

CROSS-REFERENCE TO RELATED APPLICATIONS

This is a division of application Ser. No. 12/135,339, filed Jun. 9, 2008(allowed) now U.S. Pat. No. 7,847,337, and claims the benefit of Japanese Patent Application No. 2007-155614, filed Jun. 12, 2007, all of which are incorporated herein by reference.

BACKGROUND OF THE INVENTION

1. Field of the Invention

The present invention relates to a semiconductor device and a method for manufacturing the semiconductor device, and specifically relates to a semiconductor device, in which a transistor for a nonvolatile memory cell having a floating gate electrode and a control electrode and a transistor for a peripheral circuit are mounted in a mixed manner on the same substrate, and a method for manufacturing the semiconductor device.

2. Description of the Related Art

A semiconductor device includes a nonvolatile semiconductor storage device called a flash memory. In general flash memories, as disclosed in Jpn. Pat. Appln. KOKAI Publication No. 2002-176114 for example, a transistor for a nonvolatile memory cell, which has two gate electrodes, one of which is a floating gate electrode as a lower gate electrode, and the other of which is a control gate electrode as an upper gate electrode, and a transistor for a peripheral circuit having the same structure as the transistor for a nonvolatile memory cell are mounted in a mixed manner on the same silicon substrate. The transistor for a nonvolatile memory cell and the transistor for a peripheral circuit are normally formed in parallel by substantially the same process, and have a structure in which an insulating film is put between a floating gate electrode composed of a polysilicon layer and a control gate electrode. In some transistors in the memory cell part and the peripheral circuit part, in order to electrically connect a polysilicon layer (FG poly-Si layer) as the floating gate electrode with a polysilicon layer (CG poly-Si layer) as the control gate electrode, an opening through which the FG poly-Si layer is exposed is formed so as to penetrate through a part of an insulating film on the FG poly-Si layer by etching.

Recently, the demand for improvement of the write speed of the memory cell with the miniaturization of the flash memory is increased. The FG poly-Si layer should be formed thinner for this demand. The opening formed in the transistor in the peripheral circuit part normally has an opening area larger than the opening formed in a selection transistor in the memory cell part, whereby the etching amount (depth) of the FG poly-Si layer in the formation of the opening in the peripheral circuit part is larger than that in the memory cell part. Therefore, if the thickness ($T_{peri}$) of the FG poly-Si layer in the peripheral circuit part is reduced so as to be equivalent to the thickness ($T_{cell}$) of the FG poly-Si layer in the memory cell part, the opening part in the peripheral circuit part penetrates through the FG poly-Si layer to reach the inside of the silicon substrate, whereby there arises a problem that short circuiting occurs between the gate electrode and the Si substrate when a contact conducting film is buried in the opening. Additionally, in the peripheral circuit part, since the FG poly-Si layer is used as a resistance element, there is also a problem that an intended resistance value cannot be secured due to the thickness reduction of the FG poly-Si layer. Further, in order to avoid the above problems, a process for individually forming the FG poly-Si layer and the opening in each of the memory cell part and the peripheral circuit part is considered; however, there arises a problem of increasing the process steps to lower the productivity.

BRIEF SUMMARY OF THE INVENTION

According to an aspect of the invention, there is provided a semiconductor device comprising: a semiconductor substrate; and a memory cell and a peripheral circuit provided on the semiconductor substrate, the memory cell having a first insulating film, a first electrode layer, a second insulating film, and a second electrode layer provided on the semiconductor substrate in order, and the peripheral circuit having the first insulating film, the first electrode layer, the second insulating film having an opening for the peripheral circuit, and the second electrode layer electrically connected to the first electrode layer through the opening for the peripheral circuit; wherein a thickness of the first electrode layer under the second insulating film of the peripheral circuit is thicker than a thickness of the first electrode layer of the memory cell.

According to another aspect of the invention, there is provided a method for manufacturing a semiconductor device, comprising: providing a first insulating film and a first electrode layer in a stacked form over both an area where a memory cell is formed and an area where a peripheral circuit is formed, which are provided on a surface of a semiconductor substrate, and forming, at a plurality of positions, element separation areas which penetrate through the first electrode layer and the first insulating film and reach inside of the semiconductor substrate; retracting an upper surface of the first electrode layer in the memory cell forming area to a position lower than the upper surface of the first electrode layer in the peripheral circuit forming area, and retracting an upper surface of each of the element separation areas in the memory cell forming area to a position further lower than the upper surface of the retracted first electrode layer; providing a second insulating film on the each element separation area and the first electrode layer, and forming openings, which penetrate through the second insulating film and reach inside of the first electrode layer, in each of the memory cell forming area and the peripheral circuit forming area in parallel; and providing a second electrode layer on the second insulating film, and connecting the second electrode layer to the first electrode layer by burying a part of the second electrode layer in each of the openings.

BRIEF DESCRIPTION OF THE SEVERAL VIEWS OF THE DRAWING

FIGS. 1A, 1B and 1C are cross-sectional views showing a manufacturing process of a semiconductor device according to an embodiment;

FIG. 3 is a cross-sectional view showing a manufacturing process of a semiconductor device according to an embodiment;

FIG. 4 is a table showing a relationship between an opening area and etching depth in a manufacturing process of the semiconductor device of an embodiment; and FIG. 5 is a graph showing the relationship shown in FIG. 4.

DETAILED DESCRIPTION OF THE INVENTION

Figure 2A:
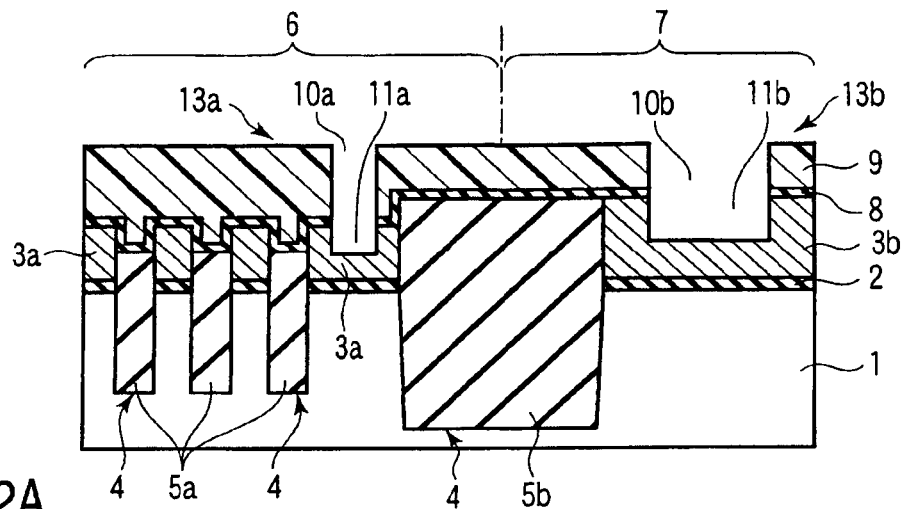
FIGS. 2A, 2B and 2C are cross-sectional views showing a manufacturing process of a semiconductor device according to an embodiment.

Hereinafter, one embodiment according to the invention is described with reference to FIGS. 1A to 5. This embodiment will describe a semiconductor device, in which a transistor for a nonvolatile memory cell having a floating gate electrode and a control gate electrode and a transistor for a peripheral circuit are mounted in a mixed manner on the same substrate, and a method for manufacturing the semiconductor device.

As shown in FIG. 1A, a first insulating film 2, which is a tunnel insulating (gate insulating) film of a memory cell, is provided on the entire surface of a silicon substrate 1 as a semiconductor layer (a semiconductor substrate). In this case, a silicon oxide ($SiO_2$) film with a thickness of about 8 to 10 nm is formed. Subsequently, a first electrode layer 3, which is a floating gate electrode of the memory cell, is provided on the entire surface of the silicon oxide (tunnel oxide) film 2. A polysilicon film with phosphorus (P) of about 3e20 atoms/$cm^3$ as impurities doped therein is usually used in the first electrode film 3. In this embodiment, as the first electrode layer 3, a phosphorous-doped polysilicon film with the film thickness of about 50 to 100 nm is formed by a CVD method.

Then, a plurality of element separation trenches 4 which penetrates through the phosphorous-doped polysilicon film 3 and the silicon oxide film 2 to reach the inside of the silicon substrate 1 is formed by anisotropic etching. Subsequently, in order to fill an insulating film, which is composed of a silicon oxide film ($SiO_2$ film) and the like, in each of the element separation trenches 4 used for separating the memory cell and an element area, the insulating film is provided on the entire surface of the silicon substrate 1 by the CVD method. The insulating film on the surface of the phosphorous-doped polysilicon film 3 is polished until the surface of the phosphorous-doped polysilicon film 3 is exposed, whereby the insulating film is filled in each of the element separation trenches 4 to form a plurality of element separation insulting films 5 for shallow trench isolation (STI) and for separating a memory element.

Incidentally, the area of the left side of the dashed line in FIG. 1A is a memory cell forming area (memory cell part) 6 where the memory cell is formed. Meanwhile, the area of the right side of the dashed line in FIG. 1A is a peripheral circuit forming area (peripheral circuit part) 7 where the peripheral circuit is formed. The separation between the memory cell forming area 6 and the peripheral circuit forming area 7 is performed on the element separation trenches 4. The definition of the memory cell forming area 6 and the peripheral circuit forming area 7 in FIG. 1A is assumed to be the same as in FIGS. 1B to 3 to be referred later.

Next, as shown in FIG. 1B, the upper surfaces of a phosphorous-doped polysilicon film 3a and an element separation area 5a in the memory cell forming area 6 are retracted to the position lower then the upper surface of a phosphorous-doped polysilicon film 3b in the peripheral circuit forming area 7. Specifically, although an illustration is omitted, a mask layer composed of a photoresist is provided on the surfaces of the phosphorous-doped polysilicon film 3 and the element separation area 5 over the memory cell forming area 6 and the peripheral circuit forming area 7. The mask layer is then patterned to leave the mask layer only on the surface of an element separation area 5b formed in the boundary part between the memory cell forming area 6 and the peripheral circuit forming area 7 and the phosphorous-doped polysilicon film 3b in the peripheral circuit forming area 7, whereby the surfaces of the phosphorous-doped polysilicon film 3a and the element separation area 5a in the memory cell forming area 6 are exposed from the mask layer.

Subsequently, the upper parts of the phosphorous-doped polysilicon film 3a and each of the element separation areas 5a in the memory cell forming area 6 exposed from the mask layer are etched by the reactive ion etching (RIE) process. At that time, a gas which can etch the silicon oxide film composing each of the element separation areas 5a at a speed higher than the speed of etching the phosphorous-doped polysilicon film 3a is used as the etching gas. For example, $C_4F_8$ gas, CO gas, Ar gas, or $O_2$ gas are enumerated as such the etching gas. Thereby, the upper surface of the phosphorous-doped polysilicon film 3a in the memory cell forming area 6 is retracted to the position lower than the upper surface of the phosphorous-doped polysilicon film 3b in the peripheral circuit forming area 7. In parallel with this, the upper surface of each of the element separation areas 5a in the memory cell forming area 6 is selectively retracted in a self-alignment manner to a position further lower than the upper surface of the phosphorous-doped polysilicon film 3a in the memory cell forming area 6. In this embodiment, the RIE process is adjusted so as to provide differences in level by each of the element separation areas 5a is etched deeper by about 30 nm than the phosphorous-doped polysilicon film 3a.

The RIE process is performed under the above setting, whereby each of the element separation areas 5a is etched until the upper surface of each of the element separation areas 5a is lowered by about 40 nm from the upper surface of the phosphorous-doped polysilicon film 3b, so that the differences in level are provided in the peripheral circuit forming area 7. Thereby, the phosphorous-doped polysilicon film 3a in the memory cell forming area 6 is etched until the upper surface of the phosphorous-doped polysilicon film 3a is positioned about 10 nm below the upper surface of the phosphorous-doped polysilicon film 3b in the peripheral circuit forming area 7. As a result, the film thickness of the phosphorous-doped polysilicon film 3a in the memory cell forming area 6 is thinner by about 10 nm than that of the phosphorous-doped polysilicon film 3b in the peripheral circuit forming area 7. Namely, the film thickness of the phosphorous-doped polysilicon film 3a in the memory cell forming area 6 is about 40 to 90 nm. After the termination of the RIE process, the mask layer is removed from the surfaces of the phosphorous-doped polysilicon film 3b and the element separation areas 5b in the peripheral circuit forming area 7.

Then, a second insulating film 8 as an insulating film between electrodes is provided on the entire surfaces of the phosphorous-doped polysilicon film 3a and the element separation areas 5a in the memory cell forming area 6 of which upper surfaces have been retracted and the phosphorous-doped polysilicon film 3b and the element separation areas 5b in the peripheral circuit forming area 7. As the second insulating film 8, for example, which is a film used as an inter-poly insulating film of the memory cell, a stacked insulating film with an ONO structure in which a silicon nitride (SiN) film is put between a silicon oxide ($SiO_2$) film having upper and lower layers may be formed.

Next, as shown in FIG. 1C, a mask layer 9 composed of a photoresist is provided on the entire surface of the second insulating film 8. The mask layer 9 is then patterned to form a first opening for a selection transistor 10a and a first opening for a peripheral circuit 10b, through which a part of the surface of the second insulating film 8 is exposed, in each of the memory cell forming area 6 and the peripheral circuit forming area 7 so that the openings 10a and 10b penetrate through the mask layer 9 respectively. The openings 10a and 10b are formed at a position corresponding to a second opening for a selection transistor 11a and a second opening for a peripheral circuit 11b respectively, which are formed to bury a second electrode layer 12 to be described later in the inside of the phosphorous-doped polysilicon films 3a and 3b in each of the selection transistor in the memory cell forming area 6 and the peripheral circuit forming area 7.

Next, as shown in FIG. 2A, the second insulating film 8 with the surface exposed through each of the first opening for the selection transistor 10*a* and the first opening for the peripheral circuit 10*b* is removed by a normal lithography process and etching process to expose, in each of the openings 10*a* and 10*b*, a part of the surface of the phosphorous-doped polysilicon films 3*a* and 3*b* in each of the memory cell forming area 6 and the peripheral circuit forming area 7. Subsequently, by a similar process, each of the phosphorous-doped polysilicon films 3*a* and 3*b* in the lower part of each of the openings 10*a* and 10*b* are respectively dug down in parallel until reaching a predetermined depth. Thereby, the second opening for the selection transistor 11*a* and the second opening for the peripheral circuit 11*b* respectively, which penetrate through the second insulating film 8 to reach the inside of each of the phosphorous-doped polysilicon films 3*a* and 3*b*, are respectively formed in parallel in the memory cell forming area 6 and the peripheral circuit forming area 7. Specifically, the openings 11*a* and 11*b* are respectively formed in transistor areas 13*a* and 13*b*, in which transistor elements 16 and 17 to be described later are respectively formed, in the memory cell forming area 6 and the peripheral circuit forming area 7.

Here, a relationship between the opening area of each of the openings 11*a* and 11*b* and the depth of each of the openings 11*a* and 11*b* is described with reference to FIGS. 4 and 5. FIG. 4 is a table showing a relationship between the opening area of each of the openings 11*a* and 11*b* and the depth (amount) of etching of the phosphorous-doped polysilicon films 3*a* and 3*b* in the formation of each of the openings 11*a* and 11*b*. FIG. 5 is a graph showing the plotted relationship shown in FIG. 4.

As shown in FIGS. 4 and 5, when the phosphorous-doped polysilicon films 3*a* and 3*b* are etched by etching to form each of the openings 11*a* and 11*b*, as the opening area of each of the openings 11*a* and 11*b* becomes larger, the depth (amount) of etching of the phosphorous-doped polysilicon films 3*a* and 3*b* becomes larger. In addition, the opening 11*b* formed in the peripheral circuit forming area (peripheral circuit part) 7 usually has the opening area larger than the opening 11 *a* formed in the memory cell forming area (memory cell part) 6. Therefore, in the case in which the film thickness of the phosphorous-doped polysilicon film 3*b* in the peripheral circuit forming area 7 is equivalent to or not more than that of the phosphorous-doped polysilicon film 3*a* in the memory cell forming area 6, when each of the openings 11*a* and 11*b* is formed in parallel by the same etching process, the opening 11*b* may be formed so as to penetrate through the phosphorous-doped polysilicon film 3*b* provided directly under the opening 11*b* and the silicon oxide film 2 to reach the inside of the silicon substrate 1, leading to the occurrence of short circuiting between the gate electrode and the silicon substrate.

Therefore, the phosphorous-doped polysilicon films 3*a* and 3*b* are required to be formed so as to have the film thickness different from each other, in accordance with the opening area and depth of each of the openings 11*a* and 11*b*. More specifically, the film thickness of the phosphorous-doped polysilicon film 3*b* in the peripheral circuit forming area 7 is set to be equal to or not less than the value obtained by adding the film thickness of the phosphorous-doped polysilicon film 3*a* in the memory cell forming area 6 to the value, which is obtained by subtracting the etching depth of the phosphorous-doped polysilicon film 3*a* in the formation of the opening 11*a* in the memory cell forming area 6 from the etching depth of the phosphorous-doped polysilicon film 3*b* in the formation of the opening 11*b* in the peripheral circuit forming area 7. This description is represented by the following expression: the film thickness of the phosphorous-doped polysilicon film 3*b* in the peripheral circuit forming area 7> the film thickness of the phosphorous-doped polysilicon film 3*a* in the memory cell forming area 6+ [(etching depth of phosphorous-doped polysilicon film 3*b* in formation of opening 11*b* in peripheral circuit forming area 7)—(etching depth of phosphorous-doped polysilicon film 3*a* in formation of opening 11*a* in memory cell forming area 6)].

In this embodiment, the opening 11*a* with the opening area of about 0.015 µm² is formed in the memory cell forming area 6. The depth of the opening 11*a* is about 20 nm as shown in FIGS. 4 and 5. Meanwhile, the opening 11*b* with the opening area of about 0.1 µm² is formed in the peripheral circuit forming area 7. Thereby, the depth of the opening 11*b* is about 30 nm as shown in FIGS. 4 and 5. In this case, the value, which is obtained by subtracting the etching depth of the phosphorous-doped polysilicon film 3*a* in the formation of the opening 11*a* in the memory cell forming area 6 from the etching depth of the phosphorous-doped polysilicon film 3*b* in the formation of the opening 11*b* in the peripheral circuit forming area 7, is about 10 nm. In addition, as above described, the film thickness ($T_{cell}$) of the phosphorous-doped polysilicon film 3*a* in the memory cell forming area 6 with the upper surface retracted by about 10 nm is about 40 to 90 nm, and, at the same time, the film thickness ($T_{peri}$) of the phosphorous-doped polysilicon film 3*b* in the peripheral circuit forming area 7 is about 50 to 100 nm.

Thus, in this embodiment, the film thickness of the phosphorous-doped polysilicon film 3*a* in the memory cell forming area 6 and the film thickness of the phosphorous-doped polysilicon film 3*b* in the peripheral circuit forming area 7 remaining on the silicon substrate 1 satisfy the above-mentioned relationship. Therefore, there is no possibility that the opening 11*b* is formed so as to penetrate through the phosphorous-doped polysilicon film 3*b* provided directly under the opening 11*b* and the silicon oxide film 2, and thus, to reach the inside of the silicon substrate 1. According to the above process, the film thickness of the phosphorous-doped polysilicon film 3*a* provided directly under the opening 11*a* and the film thickness of the phosphorous-doped polysilicon film 3*b* provided directly under the opening 11*b* are about 20 to 70 nm to have the substantially same size. After the termination of the RIE process of forming the openings 11*a* and 11*b*, the mask layer 9 is removed from the surface of the second insulating film 8.

Figure 2B:
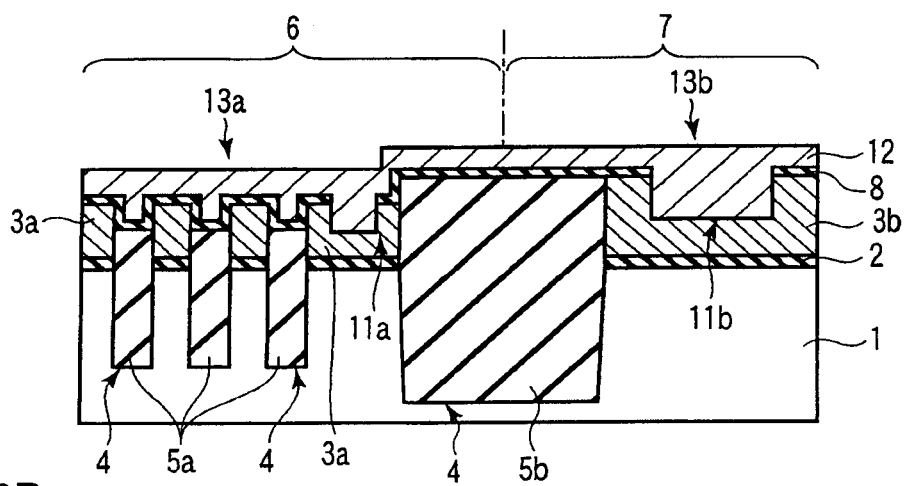

Next, as shown in FIG. 2B, a second electrode layer 12 is provided on the entire surface of the second insulating film 8 with the openings 11*a* and 11*b* formed therein. In this case, as the second electrode layer 12, a high melting point metal layer or a high melting point metal silicide layer is formed by a CVD method, a spattering method, a heating treatment, or other method. A part of the second electrode layer 12 penetrates through the second insulating film 8 to be buried in the respective openings 11*a* and 11*b*, whereby the phosphorous-doped polysilicon films 3*a* and 3*b*, which are respectively the second electrode layer 12 and a first electrode layer, are directly electrically connected to each other in each of the transistor forming areas 13*a* and 13*b* in the memory cell forming area 6 and the peripheral circuit forming area 7.

Figure 2C:
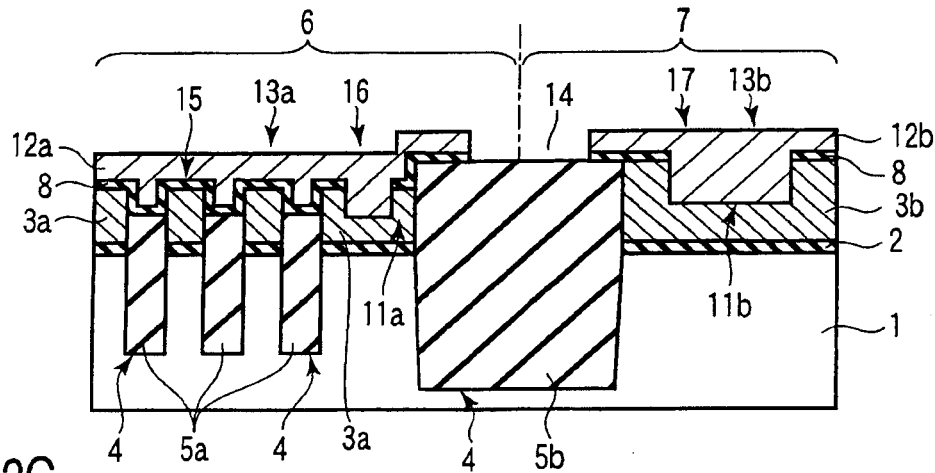

Next, as shown in FIG. 2C, each part of the second electrode layer 12 and the second insulating film 8 located above the element separation area 5*b*, which is formed in the boundary part between the memory cell forming area 6 and peripheral circuit forming area 7, is dug by etching to form an opening 14, whereby a part of the upper surface of the element separation area 5*b* is exposed in the opening 14, and there-with, although an illustration is omitted, the second electrode layer 12, the second insulating film 8 and the phosphorous-doped polysilicon films 3a and 3b are processed into a predetermined gate pattern. Subsequently, although an illustration is omitted, impurities are implanted into the surface part of the silicon substrate 1 to be diffused by an ion implantation method and a thermal diffusion treatment, whereby a source/drain diffusion layer (not shown) is formed in the surface part of the silicon substrate 1.

By the above process, a plurality of floating-gate transistors 15 for a memory cell, which is provided so that the second insulating film 8, which is the insulating film between electrodes, is put between the phosphorous-doped polysilicon film 3a as the floating gate electrode (lower gate electrode) and the second electrode layer 12 as the control gate electrode (lower gate electrode), is electrically separated from each other by each of the element separation areas 5a to be formed in the transistor forming area 13a in the memory cell forming area 6. At the same time, a selection transistor 16 in which the second electrode layer 12 and the phosphorous-doped polysilicon film 3a are electrically directly connected to each other through the opening 11a is electrically separated from each of the transistors 15 for the memory cell by the element separation areas 5a to be formed in the transistor forming area 13a in the memory cell forming area 6. The transistor forming area 13a in the memory cell forming area 6 where the floating-gate transistors 15 are formed is also called a memory cell array area.

As with the selection transistor 16 in the memory cell forming area 6, a transistor 17 for a peripheral circuit in which the second electrode layer 12 and the phosphorous-doped polysilicon film 3b are electrically directly connected to each other through the opening 11b is electrically separated from each of the transistor 15 for a memory cell and the selection transistor 16 by the element separation areas 5b to be formed in the transistor forming area 13b in the peripheral circuit forming area 7. The phosphorous-doped polysilicon film 3b is used as resistance in the peripheral circuit transistor 17.

Next, as shown in FIG. 3, a third insulating film 18, which is an interlayer insulating film, is provided on the entire surface of the second electrode layer 12. In this case, the inside of the opening 14 formed on the element separation area 5b is filled with the third insulating film 18. The third insulating film 18 may be formed by using a general insulating film such as a silicon oxide film ($SiO_2$ film) and a low-relative-permittivity insulating film with a relative permittivity lower than that of the silicon oxide film.

Then, a contact plug 19a, which penetrates through the third insulating film 18 over the second electrode layer 12a formed on the element separation area 5b to be electrically connected to the second electrode 12a, is formed in the memory cell forming area 6. In parallel with this, a contact plague 19b which penetrates through the third insulating film 18 over the second insulating film 8 of the transistor 17 to be electrically connected to the second electrode layer 12b is formed in the peripheral circuit forming area 7. Additionally, although an illustration is omitted, when a contact plague is formed in the memory cell array area, a contact plague to an element area where for example a source/drain area of a peripheral transistor is formed is also formed at the same time. Thereafter, upper wires 21a and 21b are respectively provided on the third insulating film 18 in the memory cell forming area 6 and the peripheral circuit forming area 7 to be electrically connected to each of the plagues 19a and 19b. With that, the major process in the manufacturing process of the NAND flash memory as a nonvolatile semiconductor device according to this embodiment is terminated.

As a result, as shown in FIG. 3, the NAND flash memory, as the semiconductor device, is manufactured comprise of the semiconductor substrate 1, and the memory cells 15 and the peripheral circuit 17 provided on the semiconductor substrate 1. The memory cells 15 have the first insulating film 2, the first electrode layer 3a (3), the second insulating film 8, and the second electrode layer 12a (12) provided with stacking on the semiconductor substrate 1 in order. The peripheral circuit 17 has the first insulating film 2, the first electrode layer 3b (3), the second insulating film 8 having the second opening for the peripheral circuit 11b, and the second electrode layer 12b (12) electrically connected to the first electrode layer 3b through the second opening for the peripheral circuit 11b. And, the thickness of the first electrode layer 3b under the second insulating film 8 of the peripheral circuit 17 is thicker than the thickness of the first electrode layer 3a of the memory cells 15.

And more, as shown in FIG. 3, the selection transistor 16 is provided on the semiconductor substrate 1 adjacent to the memory cells 15. The selection transistor 16 has the first insulating film 2, the first electrode layer 3a (3), the second insulating film 8 having the second opening for the selection transistor 11a, and the second electrode layer 12a (12) electrically connected to the first electrode layer 3a through the opening for the selection transistor 11a. And the thickness of the first electrode layer 3b under the second insulating film 8 of the peripheral circuit 17 is thicker than the thickness of the first electrode layer 3a under the second insulating film 8 of the selection transistor 16.

Further more, as shown in FIG. 3, the opening for the peripheral circuit 11b and the opening for the selection transistor 11a are formed with penetrating through the second insulating film 8 and reaching inside of the first electrode layer 3a, 3b respectively. And the thickness of the first electrode layer 3b under the second insulating film 8 of the peripheral circuit 17 is equal to or not less than the value obtained by adding the value, which is obtained by subtracting the depth of the opening for the selection transistor 11a in the first electrode layer 3a of the selection transistor 16 from the depth of the opening for the peripheral circuit 11b in the first electrode layer 3b of the peripheral circuit 17, to the thickness of the first electrode layer 3a under the second insulating film 8 of the memory cells 15 and the selection transistor 17.

As above described, according to this embodiment, the phosphorous-doped polysilicon films 3a and 3b with the film thickness in the peripheral circuit forming area 7 thicker than that in the memory cell forming area 6 can be formed at a time by the same process. More specifically, the film thickness of the phosphorous-doped polysilicon film 3a, which is the floating gate electrode of the transistor 15 for a memory cell or the lower electrode of the selection transistor 16, and the film thickness of the phosphorous-doped polysilicon film 3b, which is the resistance part of the transistor 17 for a peripheral circuit, can be set so as to have a size different from each other in accordance with the size of the opening area of each of the openings 11a and 11b formed in each of the areas 6 and 7 without excessively increasing the number of the film formation process.

As a result, there is a less possibility that the openings 11a and 11b respectively penetrate through the phosphorous-doped polysilicon films 3a and 3b, whereby the short circuiting between the gate electrode and the silicon substrate can hardly occur. In addition, each of the memory cells 15 can be miniaturized in size to be highly integrated while ensuring the operational characteristics such as a write characteristic of each of the memory cells 15. Further, the improvement of the operating speed of each of the memory cells 15 and the stability of the operation of the transistor 17 for a peripheral circuit can be realized at the same time. Moreover, the NAND flash memory having the above structure and characteristics can be effectively manufactured.

Recently, the demand for improvement of the write speed of the flash memory with the miniaturization of the flash memory is increased. However, mere miniaturizing the NAND memory cell, a capacitance between adjacent floating gates of the memory cell is increased to increase inter-cell interference (interference effect between adjacent cells). If the inter-cell interference is increased, the write speed of the flash memory is reduced. Meanwhile, when the FG poly-Si layer as the floating gate of the memory cell is formed to have a large thickness in order to improve the write speed of the flash memory, the ratio represented by the film thickness of the FG poly-Si layer/design dimension becomes large. If the ratio becomes large, the process of the FG poly-Si layer becomes difficult. In other words, the miniaturization of the flash memory becomes difficult. Meanwhile, in the above embodiment, the FG poly-Si layer (phosphorous-doped polysilicon film) 3a of each of the memory cells 15 is in thin-film form, whereby the miniaturization of the flash memory and the improvement of the write speed can be realized at the same time.

Further, in the above embodiment, regarding the openings 10a (11a) and 10b (11b) respectively formed in the memory cell forming area 6 and the peripheral circuit forming area 7, the opening 10b (11b) in the peripheral circuit forming area 7 is formed at a time without being divided. If the opening 10b (11b) is divided and formed, the effective opening area of the openings 10b and 11b is reduced, whereby the contact resistance is increased. In order to prevent this, it is preferable that the opening 10b (11b) in the peripheral circuit forming area 7 is formed at a time without being divided.

It is to be noted that the semiconductor device and the method for manufacturing the same according to the invention are not restricted to the above embodiment. A part of the structure or the manufacturing process of the invention can be changed to various settings, or various settings may be appropriately combined and carried out without departing from the scope of the invention.

For instance, the film thickness of the phosphorous-doped polysilicon films 3a and 3b is not limited to the above-mentioned size. The film thickness of the phosphorous-doped polysilicon films 3a and 3b may be set to an appropriate size in accordance with a specification value of a circuit required for the NAND flash memory. Specifically, the film thickness of the phosphorous-doped polysilicon film 3a in the memory cell forming area 6 may be set to an appropriate size in accordance with a coupling ratio of each of the memory cells 15 for example. Likewise, the film thickness of the phosphorous-doped polysilicon film 3b in the circuit forming area 7 may be set to an appropriate size in accordance with a resistance value required for the transistor 17 for a peripheral circuit. More specifically, when the NAND flash memory is manufactured by a wiring rule of the order of 43 nm, the film thickness of the phosphorous-doped polysilicon film 3a in the memory cell forming area 6 may be set to about 60 nm. Meanwhile, the film thickness of the phosphorous-doped polysilicon film 3b in the circuit forming area 7 may be set to about 70 nm.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
providing a first insulating film and a first electrode layer in a stacked form over both an area where a memory cell is formed and an area where a peripheral circuit is formed, which are provided on a semiconductor substrate, and forming, at a plurality of positions, element separation areas which penetrate through the first electrode layer and the first insulating film and reach inside of the semiconductor substrate;
retracting an upper surface of the first electrode layer in the memory cell forming area to a position lower than the upper surface of the first electrode layer in the peripheral circuit forming area, and retracting an upper surface of each of the element separation areas in the memory cell forming area to a position further lower than the upper surface of the retracted first electrode layer;
providing a second insulating film on the each element separation area and the first electrode layer, and forming openings, which penetrate through the second insulating film and reach inside of the first electrode layer, in each of the memory cell forming area and the peripheral circuit forming area in parallel; and
providing a second electrode layer on the second insulating film, and connecting the second electrode layer to the first electrode layer by burying a part of the second electrode layer in each of the openings.

2. The method according to claim 1, wherein the upper surface of the first electrode layer in the memory cell forming area is retracted, whereby the first electrode layer with the film thickness equivalent to or not less than a value, that is obtained by subtracting a value, which is obtained by subtracting a depth of etching of the first electrode layer in the memory cell forming area from a depth of etching of the first electrode layer in the peripheral circuit forming area in the formation of each of the openings, from the thickness of the first electrode layer in the peripheral circuit forming area, is left in the memory cell forming area.

3. The method according to claim 1, wherein the upper surface of the first electrode layer in the memory cell forming area and the upper surface of the each element separation area are retracted in parallel by etching, and the upper surface of the each element separation area is retracted selectively and in a self-alignment manner to a position further lower than the upper surface of the first electrode layer.

4. The method according to claim 1, wherein each of the upper surfaces of the first electrode layer and the each element separation area in the memory cell forming area is retracted with the use of an etching gas which can etch the each element separation area at a speed higher than the speed of etching the first electrode layer.

5. The method according to claim 1, wherein the each element separation area is formed of a material easier to be etched than the first electrode layer.

6. The method according to claim 1, wherein the opening having the opening area larger than the opening area of the opening formed in the memory cell forming area is formed in the peripheral circuit forming area.

7. The method according to claim 1, wherein the thickness of the first electrode layer in each of the memory cell forming area and the peripheral circuit forming area is set to be different from each other in accordance with the size of the opening area of the openings respectively formed in the memory cell forming area and the peripheral circuit forming area.

\* \* \* \* \*